US011515900B1

(12) United States Patent
Li

(10) Patent No.: US 11,515,900 B1
(45) Date of Patent: Nov. 29, 2022

(54) TRANSMITTER CIRCUIT

(71) Applicant: AMAZING MICROELECTRONIC CORP., New Taipei (TW)

(72) Inventor: Guan-Shun Li, Wandan Township (TW)

(73) Assignee: AMAZING MICROELECTRONICS CORP., New Taipei (TW)

( * ) Notice: Subject to any disclaimer, the term of this patent is extended or adjusted under 35 U.S.C. 154(b) by 0 days.

(21) Appl. No.: 17/390,038

(22) Filed: Jul. 30, 2021

(51) Int. Cl.
*H04B 1/04* (2006.01)
*H03K 19/20* (2006.01)
*H03K 5/01* (2006.01)
*H03K 5/00* (2006.01)

(52) U.S. Cl.
CPC .............. *H04B 1/04* (2013.01); *H03K 19/20* (2013.01); *H03K 5/01* (2013.01); *H03K 2005/00013* (2013.01)

(58) Field of Classification Search
CPC .. G01R 29/02; H03F 1/26; H03F 1/32; H03G 3/20; H03G 3/30; H03K 5/01; H03K 5/24; H03K 7/06; H03K 19/20; H04B 1/04; H04B 1/40; H04B 1/44; H04B 5/00; H04B 10/04; H04B 15/02; H04L 1/00; H04L 1/02; H04L 1/0036; H04L 25/02; H04L 25/08; H04L 271/10
USPC .............. 326/21; 329/300; 363/16; 375/219, 375/258, 295, 316
See application file for complete search history.

(56) References Cited

U.S. PATENT DOCUMENTS 8,909,065 B2 12/2014 Henzler
9,941,999 B1 * 4/2018 Milesi ................. H04L 25/0268
10,230,378 B2 3/2019 Thuries et al.
2015/0171901 A1 * 6/2015 Dupuis ................ H04B 10/802
375/295
2018/0262297 A1 9/2018 Milesi

FOREIGN PATENT DOCUMENTS

CN 104826243 B 2/2018
JP 6218785 B2 10/2017

OTHER PUBLICATIONS

Taiwanese Office Action and Search Report for Taiwanese Application No. 110136262, dated Mar. 21, 2022, with English translation of the Office Action.

* cited by examiner

*Primary Examiner* — Shawkat M Ali
(74) *Attorney, Agent, or Firm* — Birch, Stewart, Kolasch & Birch, LLP

(57) ABSTRACT

A transmitter circuit applicable to a digital isolator is provided, adapted to receive a data input signal and coupled to an isolation barrier, developing a receiver input signal to a receiver circuit for generating a data output signal. The transmitter circuit generates a transmitter output signal in response to a rising edge and falling edge of the data input signal, and includes a rising and falling converter for outputting a converted data input signal according to the rising edge and falling edge of the data input signal, a delay and logic unit for receiving the converted data input signal and generating a carrier signal, and an AND gate receiving the converted data input signal and the carrier signal, and outputting the transmitter output signal. Since a number of pulses of the carrier signal is limited and definite, the present invention achieves to reduce power consumption and electromagnetic interferences effectively.

11 Claims, 12 Drawing Sheets

TRANSMITTER CIRCUIT

BACKGROUND OF THE INVENTION

Field of the Invention

The present invention is related to a transmitter circuit diagram, and more particularly to a transmitter circuit structure which is applicable to a digital isolator for reducing power consumption and electromagnetic interferences.

Description of the Prior Art

As we know, isolation circuits are the interface circuits that provide galvanic isolation between two communicating blocks, for example, a transmitter circuit (TX) and a receiver circuit (RX). Such isolation circuits are required to eliminate avoidable ground loops, and also to protect high voltage sensitive circuits. These circuits ensure electric insulation and signal isolation between the circuits, ensuring reliable data transmission between the two circuits, isolating the signal from fast transient common mode noise. In applications where common mode noise can be expected and human interactions are inevitable (e.g., cardiograph), then the isolation circuits act as an interface, ensuring safety and reliability. In several industrial applications which are susceptible to electrical surges, fast transients and high noise floors, isolation circuits have been widely used for safety and reliability.

Please refer to FIG. 1, which shows a schematic drawing of a conventional isolation circuit architecture, wherein the two communicating blocks, the transmitting circuit 10 and the receiving circuit 20 are respectively connected to a ground voltage $V_{ss1}$ and $V_{ss2}$. The isolation circuit is aimed to isolate these two ground voltages $V_{ss1}$ and $V_{ss2}$ apart. The transmitting circuit 10 includes transmitters TX_1 and TX_2, and each transmitter TX_1 and TX_2 is composed of an oscillator 11 and a mixer 12. As shown in FIG. 1, DI is an input of the transmitting circuit 10 and by employing the transmitters TX_1 and TX_2 to generate the TX output signals TXO_1 and TXO_2. The isolation capacitances 22 are configured between the transmitting circuit 10 and the receiving circuit 20 for coupling the TX output signals TXO_1 and TXO_2 from the transmitter side to the receiver side, so as to generate the RX input signals RXIN_1 and RXIN_2 for the receiving circuit 20 to receive. The receiving circuit 20 includes receivers RX_1, RX_2 and a mixer 21. The receiver RX_1 receives the RX input signal RXIN_1, the receiver RX_2 receives the RX input signal RXIN_2, and by employing the mixer 21 connected thereto, an output signal RO is generated. Please refer to FIG. 2 for the waveforms of the input signal DI, the TX output signals TXO_1 and TXO_2, the oscillator 11, the RX input signals RXIN_1 and RXIN_2, and the output signal RO in accordance with the conventional isolation circuit architecture in FIG. 1. In general, a voltage level of the input signal DI is expected to be followed by the voltage level of the output signal RO.

However, as illustrated in FIG. 1, it is worth noticing that in a conventional design module of the conventional isolation circuit architecture, an oscillator 11 is generally and inevitably used in the transmitter structure. Under such a condition, once the isolation circuit is powered on, the oscillator 11 starts to continuously output indefinite pulse carriers as shown in FIG. 2. And such indefinite pulse carriers result in causing tremendous power consumption and severe electromagnetic interference (EMI) issues. Moreover, since the oscillator 11 gives indefinite pulse carriers at all times even when the input signal DI is in transition from the logic state "0" to "1" or from the logic state "1" to "0", the TX output signals TXO_1 and TXO_2 are very likely to have the jitter problems.

In addition, as shown in the conventional isolation circuit architecture in FIG. 1, it can be seen that at least two communication channels are required. And two pairs of transmitters TX_1, TX_2 and receivers RX_1, RX_2 are necessary. As such, in such a conventional design architecture, circuit production cost and area consumption are also problems to be faced and solved. As a result, it is believed that such conventional design is still in lack of extensive utility and can not be widely used.

Under such circumstances, it, in view of all, should be apparent and obvious that there is indeed an urgent need for the professionals in the field for a novel and inventive transmitter circuit architecture to be developed, especially without the needs for oscillator configuration so as to solve the above mentioned issues, and to reduce power consumption and electromagnetic interferences at the same time.

SUMMARY OF THE INVENTION

In order to overcome the above mentioned disadvantages, one major objective in accordance with the present invention is provided for a novel and creative transmitter circuit which is applicable to a digital isolator and advantageous of reducing power consumption and electromagnetic interferences. Thereby, the present invention achieves to successfully solves the problems of prior arts and meanwhile maintain precise data transmission result as well as good system robustness.

Another objective in accordance with the present invention is provided for a novel transmitter circuit, in which no conventional oscillator is required. The inventive transmitter circuit uses a new circuit configuration to replace the conventional oscillator, and since the conventional oscillator disposed in the transmitter circuit is spared, the prior power consumption and severe electromagnetic interference issues are therefore, eliminated. Moreover, jitters of the output signals from the transmitter circuit can be avoided at the same time.

And yet another objective in accordance with the present invention is provided for a transmitter circuit, which is composed of a rising and falling converter, a delay and logic unit, and an AND gate. By integrating these circuits with equivalent simplicity, the transmitter circuit architecture is successful in preserving relatively low complexity and thus can be widely utilized in any related industries.

For achieving the above mentioned objectives, the present invention is aimed to provide a transmitter circuit, applicable to a digital isolator comprising a receiver circuit and an isolation barrier connected between the transmitter circuit and the receiver circuit. The transmitter circuit is adapted to receive a data input signal and coupled to the isolation barrier, and the isolation barrier is operable to develop a receiver input signal to the receiver circuit for accordingly generating a data output signal.

The transmitter circuit is operable to generate a transmitter output signal (TXO) in response to the data input signal. The transmitter output signal (TXO) comprises a first division signal and a second division signal, and the transmitter circuit starts to generate the first division signal responsive to a first transition of the data input signal from a first logic state to a second logic state and terminate generating the first division signal when the data input signal is still in the second logic state.

The transmitter circuit starts to generate the second division signal responsive to a second transition of the data input signal from the second logic state to the first logic state and terminate generating the second division signal when the data input signal is still in the first logic state. According to a preferred embodiment of the present invention, a first operational time of the first division signal and a second operational time of the second division signal are different. And, the transmitter output signal (TXO) is periodic since a voltage level of the data input signal should be followed by the voltage level of the transmitter output signal (TXO) and the data input signal DI is periodic.

In a preferred embodiment of the present invention, the transmitter circuit comprises a rising and falling converter, a delay and logic unit and an AND gate. The rising and falling converter is adapted to receive the data input signal and accordingly output a converted data input signal in response to a rising edge and a falling edge of the data input signal. The converted data input signal comprises a first partition signal and a second partition signal, and the rising and falling converter starts to generate the first partition signal responsive to the rising edge of the data input signal and terminate generating the first partition signal before the falling edge of the data input signal. And, the rising and falling converter starts to generate the second partition signal responsive to the falling edge of the data input signal and terminate generating the second partition signal before a next rising edge of the data input signal. And, a first working time of the first partition signal and a second working time of the second partition signal are different.

The delay and logic unit is adapted to electrically connect with the rising and falling converter for receiving the converted data input signal and accordingly generating a carrier signal, wherein the carrier signal comprises a plurality of pulses between the rising edge of the data input signal and the falling edge of the data input signal. According to the embodiment of the present invention, a number of the plurality of pulses of the carrier signal is limited and definite.

The AND gate is electrically connected with the rising and falling converter and the delay and logic unit for receiving the converted data input signal and the carrier signal, and outputting the transmitter output signal.

According to the embodiment of the present invention, the first transition of the data input signal from the first logic state to the second logic state is in response to the rising edge of the data input signal. The second transition of the data input signal from the second logic state to the first logic state is in response to the falling edge of the data input signal.

The first operational time of the first division signal of the transmitter output signal (TXO) is equal to the first working time of the first partition signal of the converted data input signal, and the second operational time of the second division signal of the transmitter output signal (TXO) is equal to the second working time of the second partition signal of the converted data input signal.

In a preferred embodiment of the present invention, the delay and logic unit comprises multiple delay cells, multiple multiplexers and an OR gate. The multiple delay cells are connected in series to receive the converted data input signal, delay the converted data input signal sequentially and output multiple delayed signals, wherein a signal delay time of each of the multiple delay cells is one period.

Each of the multiple multiplexers includes two input ends and an output end, wherein the two input ends are electrically connected to successive two of the converted data input signal and the multiple delayed signals to accordingly generate a multiplexer signal at the output end.

The OR gate is adapted to receive a plurality of the multiplexer signal from the output end of the multiple multiplexers and generate the carrier signal.

According to the embodiment of the present invention, the multiplexer signal turns to a high voltage level when a former one of the successive two of the converted data input signal and the multiple delayed signals is at the high voltage level and a later one of the successive two of the converted data input signal and the multiple delayed signals is at a low voltage level.

In another aspect, regarding the rising and falling converter configuration, the rising and falling converter comprises an inverter, a first transmission gate, a second transmission gate, a third transmission gate, a fourth transmission gate and an NOR gate, wherein the inverter receives the data input signal and outputs an inverted data input signal, a first input end of the NOR gate is electrically connected with the first transmission gate and the second transmission gate, and a second input end of the NOR gate is electrically connected with the third transmission gate and the fourth transmission gate. The first transmission gate and the third transmission gate are further connected with an input and an output of the inverter, respectively.

The data input signal is delayed by a first period and a second period to respectively control the first transmission gate and the fourth transmission gate, and the inverted data input signal is delayed by the first period and the second period to respectively control the second transmission gate and the third transmission gate, such that the NOR gate outputs the converted data input signal.

In one embodiment, when the first period is longer than the second period, the first working time of the first partition signal of the converted data input signal is longer than the second working time of the second partition signal of the converted data input signal.

In another embodiment, when the second period is longer than the first period, the second working time of the second partition signal of the converted data input signal is longer than the first working time of the first partition signal of the converted data input signal.

As a result, based on the above, it has been proved that the present invention is well designed and indeed discloses a novel transmitter circuit architecture for digital isolator fields. The whole new schemes can be employed in a transmitting circuit (TX) architecture and has been verified to succeed in minimizing system power consumption and electromagnetic interferences. Meanwhile, superior system robustness and precise data transmission results are maintained. Thus, it is believed that the present invention is advantageous of having excellent control stability over system levels as well as maintaining precise control ability to the isolation circuits while compared to the prior arts.

These and other objectives of the present invention will become obvious to those of ordinary skill in the art after reading the following detailed description of preferred embodiments.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
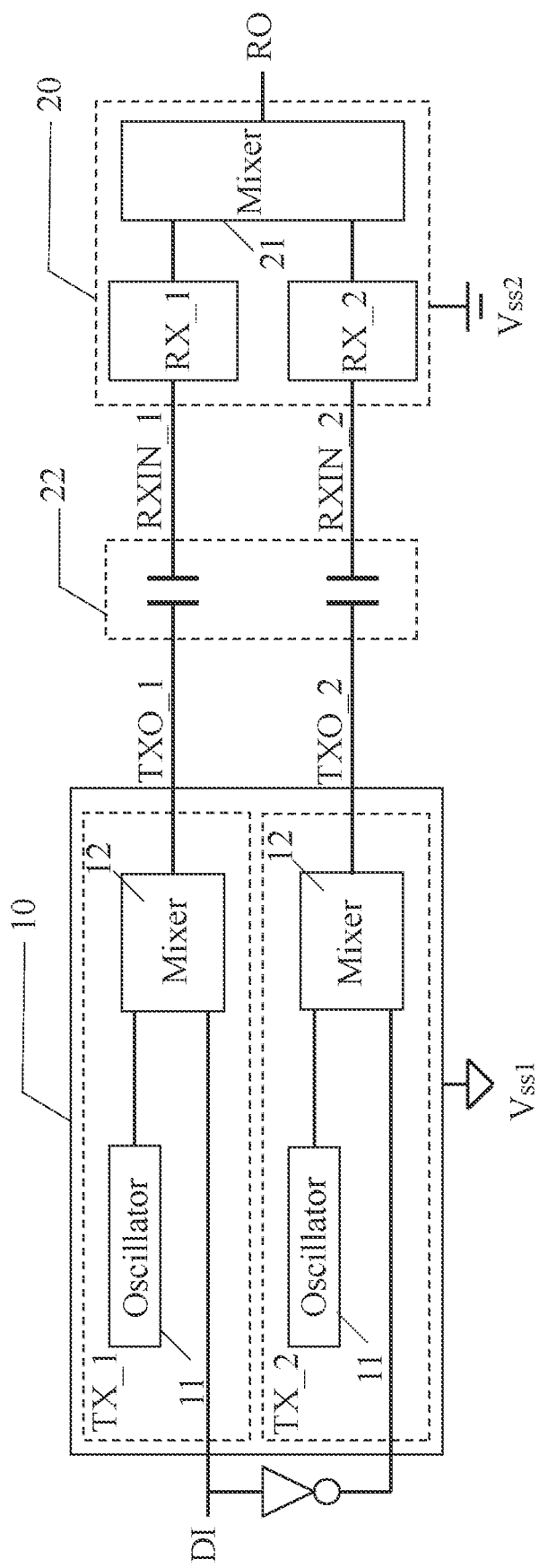
FIG. 1 shows a schematic drawing of a conventional isolation circuit architecture.
Figure 2:
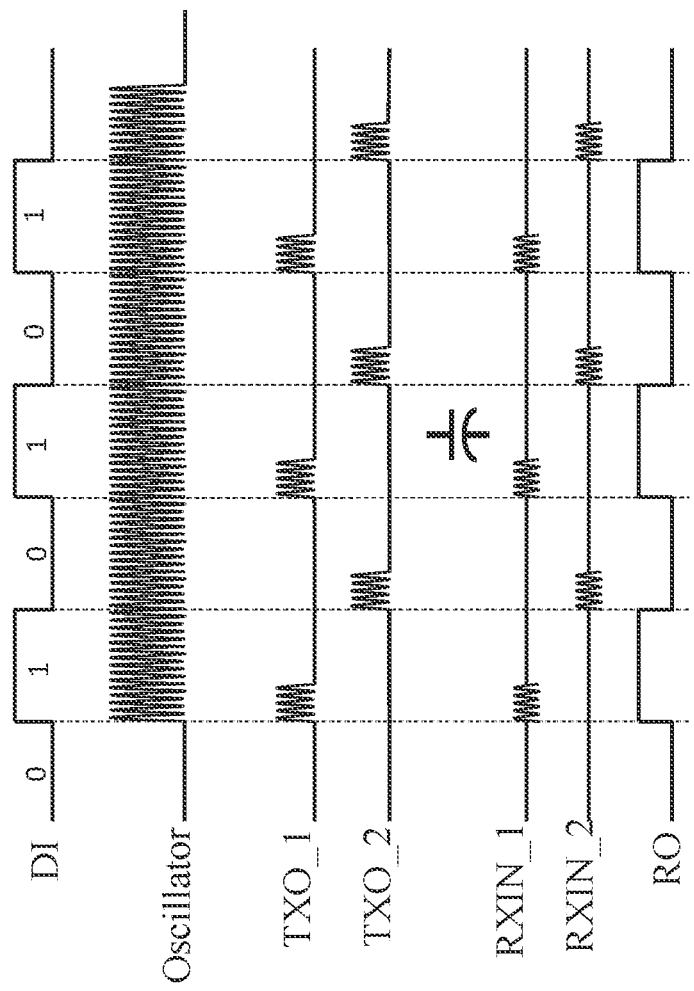
FIG. 2 shows the waveforms of the input signal, the TX output signals, the oscillator, the RX input signals and the output signal in accordance with the conventional isolation circuit architecture in FIG. 1.

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

Figure 3:
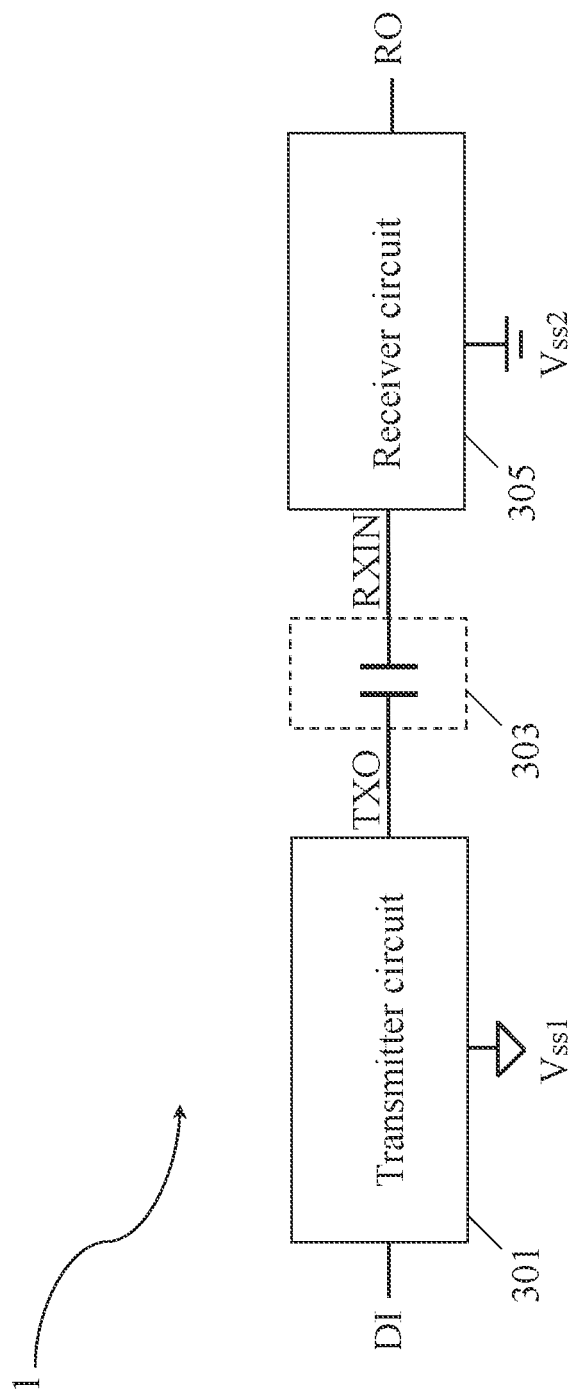
FIG. 3 shows a block diagram of a digital isolator in accordance with one embodiment of the present invention.

In the following descriptions, please refer to FIG. 3 first, in which FIG. 3 shows a block diagram of a digital isolator in accordance with one embodiment of the present invention. The digital isolator 1 includes a transmitter circuit 301, an isolation barrier 303 and a receiver circuit 305. The transmitter circuit 301 is electrically connected to a first ground voltage level $V_{ss1}$ and the receiver circuit 305 is electrically connected to a second ground voltage level $V_{ss2}$. The isolation barrier 303 is electrically connected between the transmitter circuit 301 and the receiver circuit 305. The proposed transmitter circuit 301 of the present invention is adapted to receive a data input signal DI and coupled to the isolation barrier 303, such that the isolation barrier 303 is operable to develop a receiver input signal RXIN to the receiver circuit 305 for receiving. And therefore, the receiver circuit 305 is able to process the receiver input signal RXIN and then accordingly generate a data output signal RO. In one embodiment of the present invention, the isolation barrier 303, for example can be composed of at least one isolation capacitance or the like.

According to a preferred embodiment of the present invention, the proposed transmitter circuit 301 of the present invention is aimed to be operable to generate a transmitter output signal TXO in response to the data input signal DI. Please refer to FIG. 4 for the illustrated waveforms of the data input signal DI, the transmitter output signal TXO, the receiver input signal RXIN and the data output signal RO in accordance with the embodiment architecture in FIG. 3.

Figure 4:
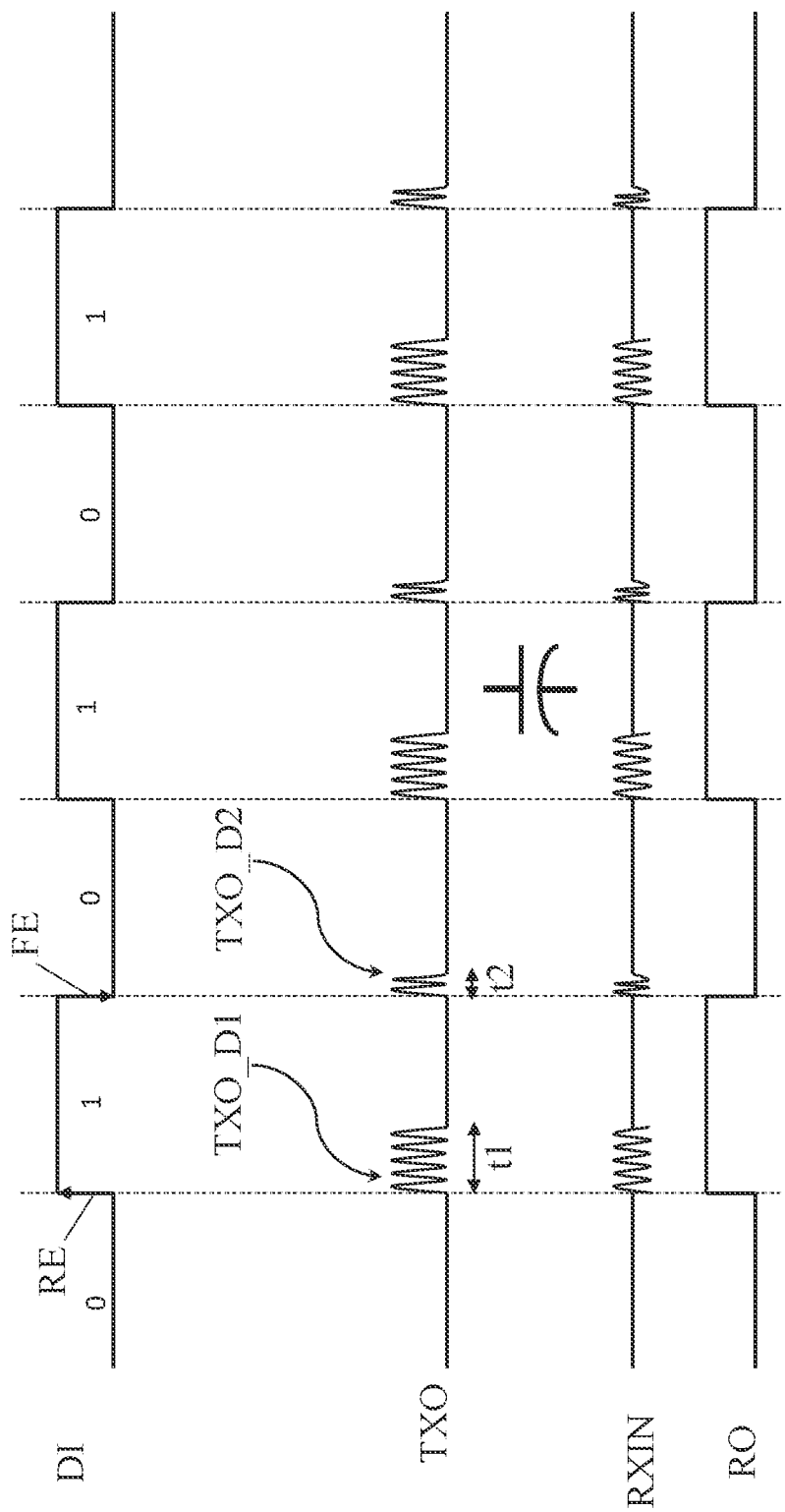
FIG. 4 shows a plurality of illustrated waveforms of the data input signal DI, the transmitter output signal TXO, the receiver input signal RXIN and the data output signal RO in accordance with the embodiment architecture in FIG. 3.

As shown in FIG. 4, it can be observed that, in general, a voltage level of the data input signal DI should be followed by the voltage level of the transmitter output signal TXO. And since the data input signal DI is periodic, the transmitter output signal TXO of the present invention will be periodic as well. In details, the transmitter output signal TXO comprises a first division signal TXO_D1 and a second division signal TXO_D2, and the transmitter output signal TXO is periodic. The transmitter circuit 301 starts to generate the first division signal TXO_D1 responsive to a first transition of the data input signal DI from a first logic state to a second logic state and terminate generating the first division signal TXO_D1 when the data input signal DI is still in the second logic state. In the embodiment of the present invention, the first logic state is indicated by the data input signal DI at a low voltage level, as the digital level "0". And, the second logic state is indicated by the data input signal DI at a high voltage level, as the digital level "1". The first transition of the data input signal DI from the first logic state to the second logic state is referred as when the data input signal DI is turning from the digital level "0" to the digital level "1" and in response to a rising edge RE of the data input signal DI. Similarly, a second transition of the data input signal DI from the second logic state to the first logic state is referred as when the data input signal DI is turning from the digital level "1" to the digital level "0" and in response to a falling edge FE of the data input signal DI.

As can be seen, the transmitter circuit 301 starts to generate the second division signal TXO_D2 responsive to the second transition of the data input signal DI from the second logic state "1" to the first logic state "0" and terminate generating the second division signal TXO_D2 when the data input signal DI is still in the first logic state "0". According to the preferred embodiment of the present invention, the first division signal TXO_D1 has a first operational time t1, and the first operational time t1 is the time segment between the transmitter circuit 301 starts to generate the first division signal TXO_D1 and to terminate generating the first division signal TXO_D1. In addition, the second division signal TXO_D2 has a second operational time t2, and the second operational time t2 is the time segment between the transmitter circuit 301 starts to generate the second division signal TXO_D2 and to terminate generating the second division signal TXO_D2. According to the embodiment of the present invention, the first operational time t1 of the first division signal TXO_D1 and the second operational time t2 of the second division signal TXO_D2 are different.

For instance, the first operational time t1 of the first division signal TXO_D1 can be longer than the second operational time t2 of the second division signal TXO_D2 as shown in FIG. 4 waveforms. Alternatively, the second operational time t2 of the second division signal TXO_D2 can be selectively longer than the first operational time t1 of the first division signal TXO_D1 according to various embodiment of the present invention. The present invention is not limited thereto.

Figure 5:
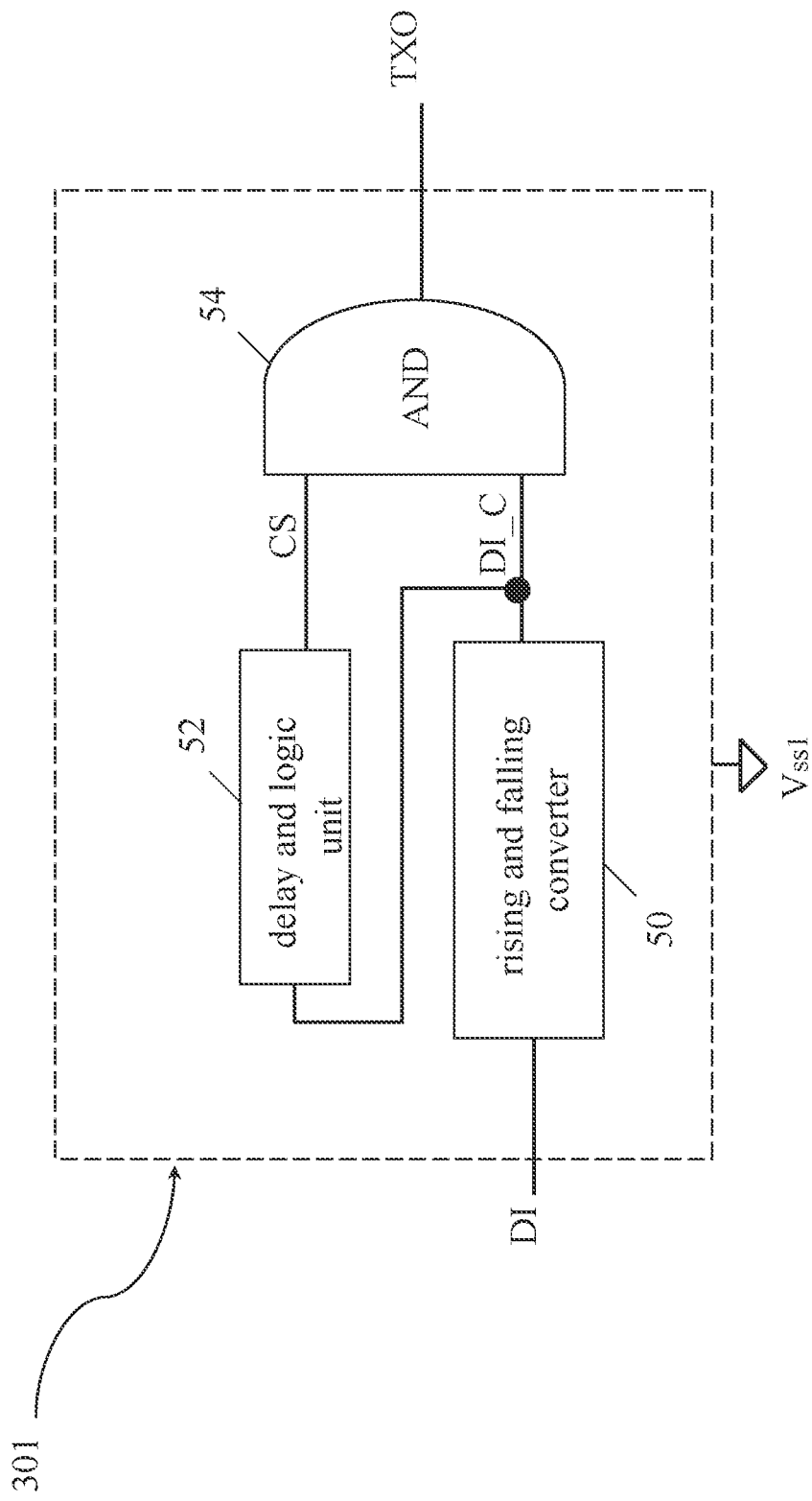
FIG. 5 shows a detailed schematic diagram of the transmitter circuit in accordance with the embodiment of the present invention.

Subsequently, please refer to FIG. 5 for a detailed schematic diagram of the transmitter circuit in accordance with the embodiment of the present invention. As shown in FIG. 5, the proposed transmitter circuit 301 comprises a rising and falling converter 50, a delay and logic unit 52, and an AND gate 54. The rising and falling converter 50 is adapted to receive the data input signal DI and accordingly output a converted data input signal DI_C. The delay and logic unit 52 is adapted to electrically connect with the rising and falling converter 50 for receiving the converted data input signal DI_C and accordingly generates a carrier signal CS. The AND gate 54 is electrically connected with the rising and falling converter 50 and the delay and logic unit 52 for receiving the converted data input signal DI_C and the carrier signal CS, and by employing an AND logic algorithm, outputting the transmitter output signal TXO.

Figure 6:
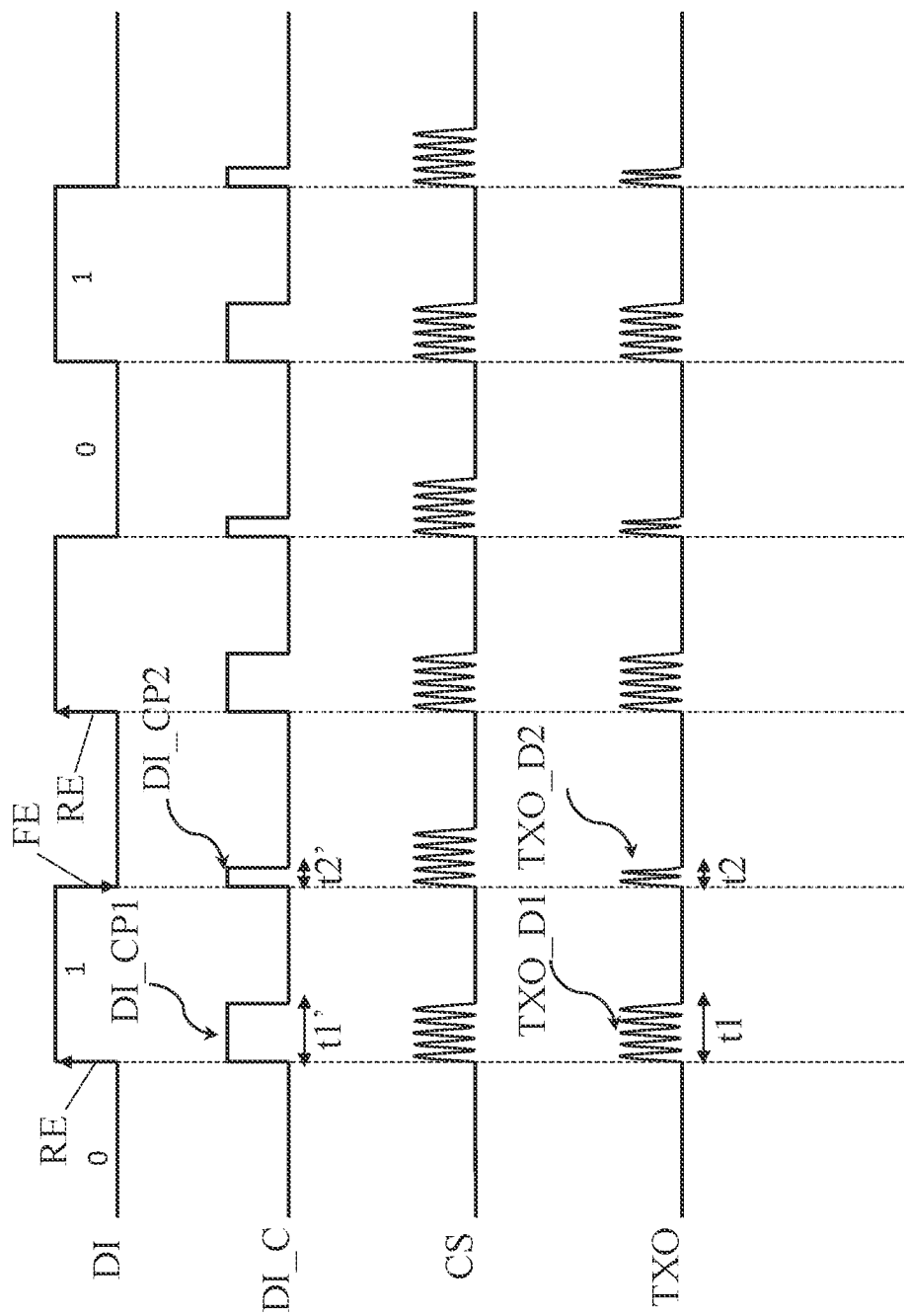
FIG. 6 shows a plurality of illustrated waveforms of the data input signal DI, the converted data input signal DI_C, the carrier signal CS and the transmitter output signal TXO in accordance with the transmitter circuit architecture in FIG. 5.

FIG. 6 shows waveforms of the data input signal DI, the converted data input signal DI_C, the carrier signal CS and the transmitter output signal TXO in accordance with the transmitter circuit architecture in FIG. 5. As we can see, the rising and falling converter 50 is adapted to receive the data input signal DI and accordingly output the converted data input signal DI_C in response to the rising edge RE and the falling edge FE of the data input signal DI. The converted data input signal DI_C comprises a first partition signal DI_CP1 and a second partition signal DI_CP2, and the converted data input signal DI_C is periodic. According to the embodiment of the present invention, the rising and falling converter 50 starts to generate the first partition signal DI_CP1 responsive to the rising edge RE of the data input signal DI and terminate generating the first partition signal DI_CP1 before the falling edge FE of the data input signal DI. And, the rising and falling converter 50 starts to generate the second partition signal DI_CP2 responsive to the falling edge FE of the data input signal DI and terminate generating the second partition signal DI_CP2 before a next rising edge RE of the data input signal DI.

According to the preferred embodiment of the present invention, the first partition signal DI_CP1 has a first working time t1', and the first working time t1' is the time segment between the rising and falling converter 50 starts to generate the first partition signal DI_CP1 and to terminate generating the first partition signal DI_CP1. The second partition signal DI_CP2 has a second working time t2', and the second working time t2' is the time segment between the rising and falling converter 50 starts to generate the second partition signal DI_CP2 and to terminate generating second partition signal DI_CP2. In the preferred embodiment of the present invention, the first working time t1' of the first partition signal DI_CP1 and the second working time t2' of the second partition signal DI_CP2 are different.

The delay and logic unit 52 is electrically connected with the rising and falling converter 50 to receive the converted data input signal DI_C and accordingly generates the carrier signal CS. It is apparent that from the waveforms as shown in FIG. 6, the carrier signal CS comprises a plurality of pulses between the rising edge RE of the data input signal DI and the falling edge FE of the data input signal DI. And, the carrier signal CS includes fixed numbers of pulses. In other words, in the embodiment of the present invention, a number of the plurality of pulses of the carrier signal CS is limited and definite.

After that, since the AND gate 54 is electrically connected with the rising and falling converter 50 and the delay and logic unit 52 and receives the converted data input signal DI_C and the carrier signal CS as the inputs of the AND gate 54, the transmitter output signal TXO is generated at the output of the AND gate 54, based on the converted data input signal DI_C and the carrier signal CS by employing the AND logic algorithm. It is worth noticing that, due to the AND logic algorithm of the AND gate 54, the first operational time t1 of the first division signal TXO_D1 of the transmitter output signal TXO will be determined as equal to the first working time t1' of the first partition signal DI_CP1 of the converted data input signal DI_C, and the second operational time t2 of the second division signal TXO_D2 of the transmitter output signal TXO will be determined as equal to the second working time t2' of the second partition signal DI_CP2 of the converted data input signal DI_C.

Figure 7:
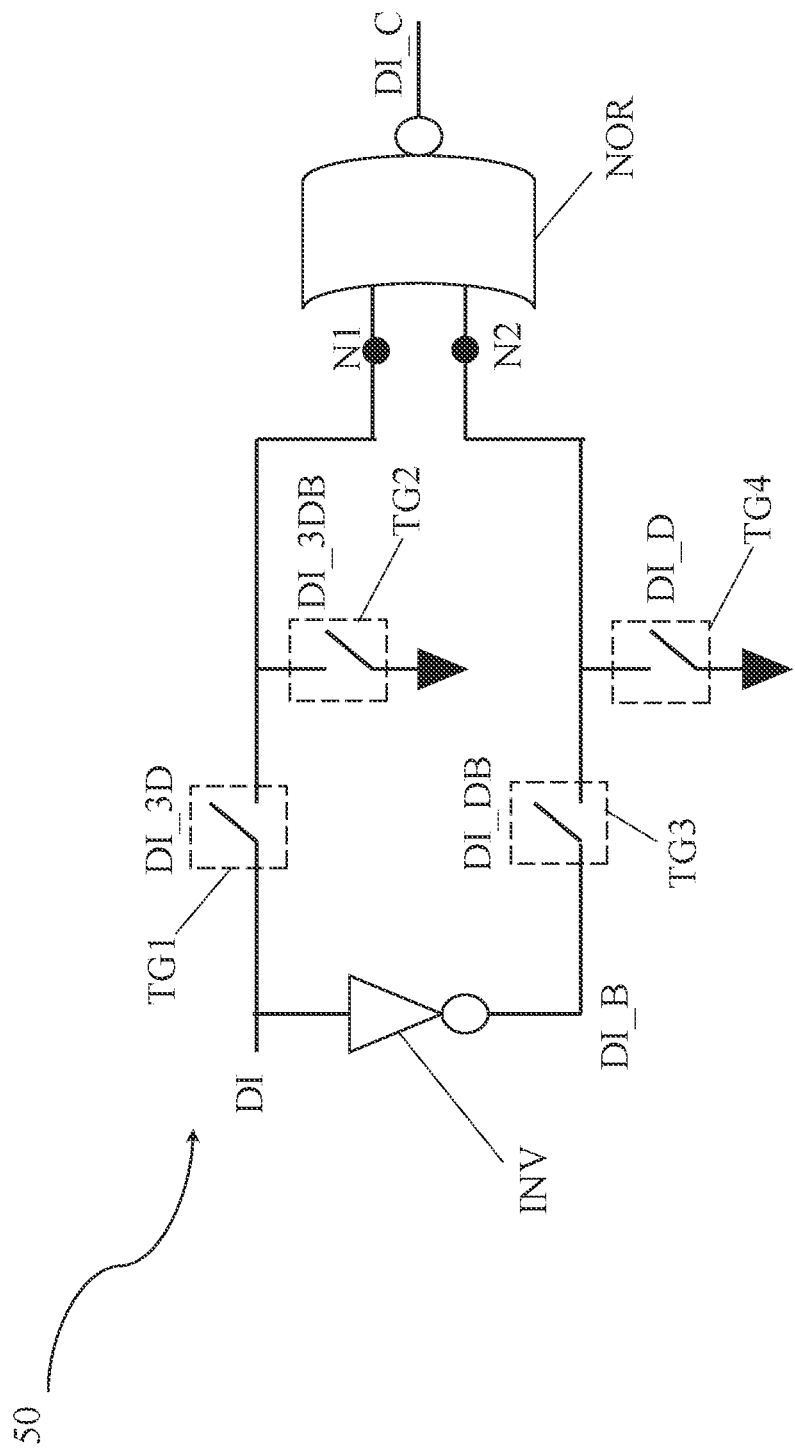
FIG. 7 shows a detailed circuit diagram of a first embodiment of the rising and falling converter in accordance with the present invention.
Figure 8:
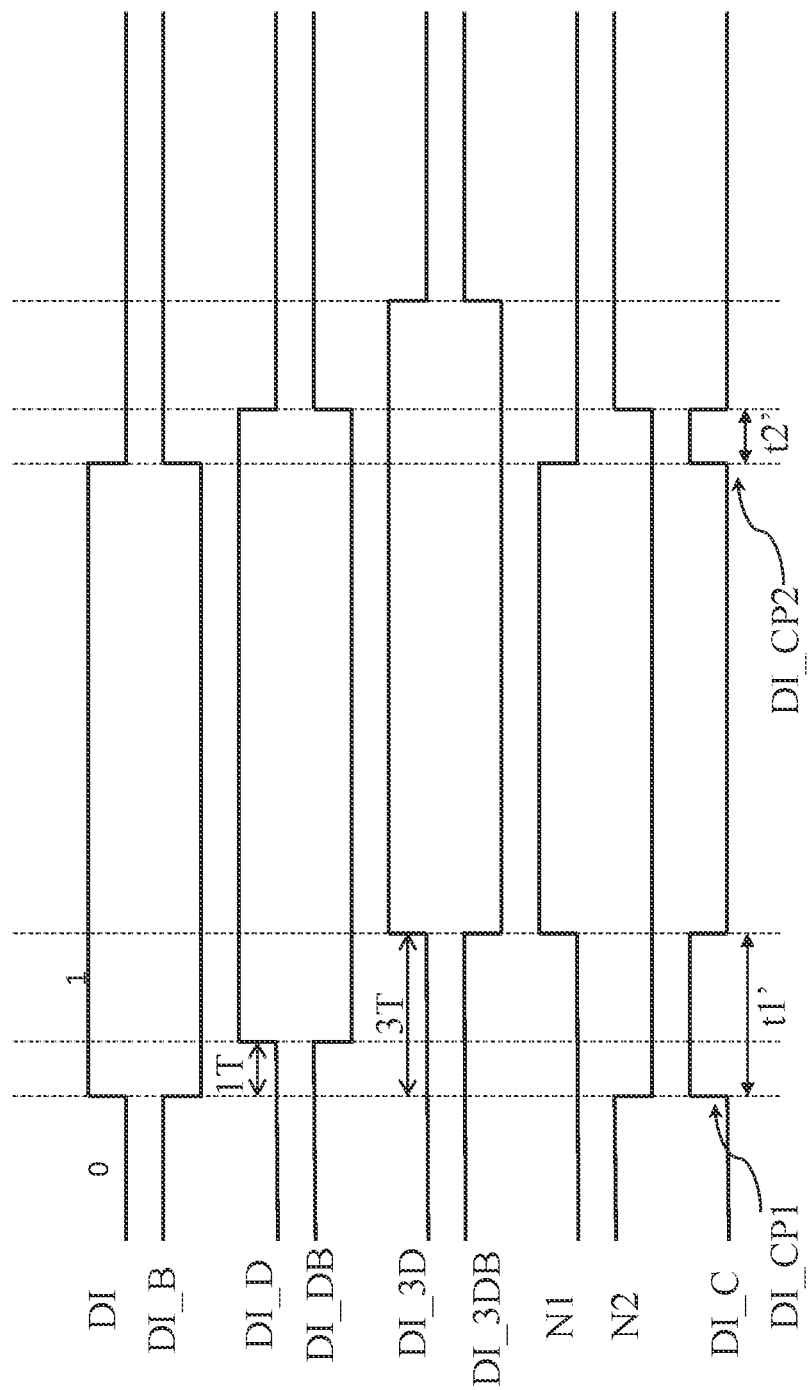
FIG. 8 shows a plurality of illustrated waveforms of the nodes as indicated in FIG. 7.

Moreover, please refer to FIG. 7 for a detailed circuit diagram of a first embodiment of the rising and falling converter in accordance with the present invention. FIG. 8 shows a plurality of the illustrated waveforms of the nodes as indicated in FIG. 7. It is shown that the rising and falling converter 50 includes an inverter INV, a first transmission gate TG1, a second transmission gate TG2, a third transmission gate TG3, a fourth transmission gate TG4 and an NOR gate NOR. The inverter INV receives the data input signal DI and outputs an inverted data input signal DI_B. The input (D1) and the output (D1_B) of the inverter INV are respectively connected with the first transmission gate TG1 and the third transmission gate TG3. The data input signal DI is delayed by a first period 3T to form the signal as illustrated as "DI_3D", and the data input signal DI is delayed by a second period 1T to form the signal as illustrated as "DI_D" according to the first embodiment of the rising and falling converter of the present invention. In such a first embodiment, the first period 3T is longer than the second period 1T. And, the delayed signal "DI_3D", which is formed by delaying the data input signal DI by the first period 3T, is generated to control the first transmission gate TG1. And, the delayed signal "DI_D", which is formed by delaying the data input signal DI by the second period 1T, is generated to control the fourth transmission gate TG4.

In a similar methodology, the inverted data input signal DI_B is delayed by the first period 3T and the second period 1T, respectively to form the delayed signal "DI_3DB" and "DI_DB". And, the delayed signal "DI_3DB" and "DI_DB" are respectively generated to control the second transmission gate TG2 and the third transmission gate TG3. A first input end N1 of the NOR gate NOR is electrically connected with the first transmission gate TG1 and the second transmission gate TG2, and a second input end N2 of the NOR gate NOR is electrically connected with the third transmission gate TG3 and the fourth transmission gate TG4. According to the embodiment of the present invention, when the control signal of the foregoing transmission gates TG1, TG2, TG3 and TG4 is at a high voltage level (digital level="1"), the transmission gates TG1, TG2, TG3 and TG4 are connected. Otherwise, if the control signal of the foregoing transmission gates TG1, TG2, TG3 and TG4 is at a low voltage level (digital level="0"), the transmission gates TG1, TG2, TG3 and TG4 are open. As a result, it is observed that the waveforms of the first input end N1 and the second input end N2 are obtained as shown in FIG. 8. And, the NOR gate NOR outputs the converted data input signal DI_C as shown in FIG. 8 waveform according to the waveforms of the first input end N1 and the second input end N2. In such a first embodiment of the rising and falling converter, the first period 3T is longer than the second period 1T, resulting in the first working time t1' of the first partition signal DI_CP1 of the converted data input signal DI_C being longer than the second working time t2' of the second partition signal DI_CP2 of the converted data input signal DI_C.

Figure 9:
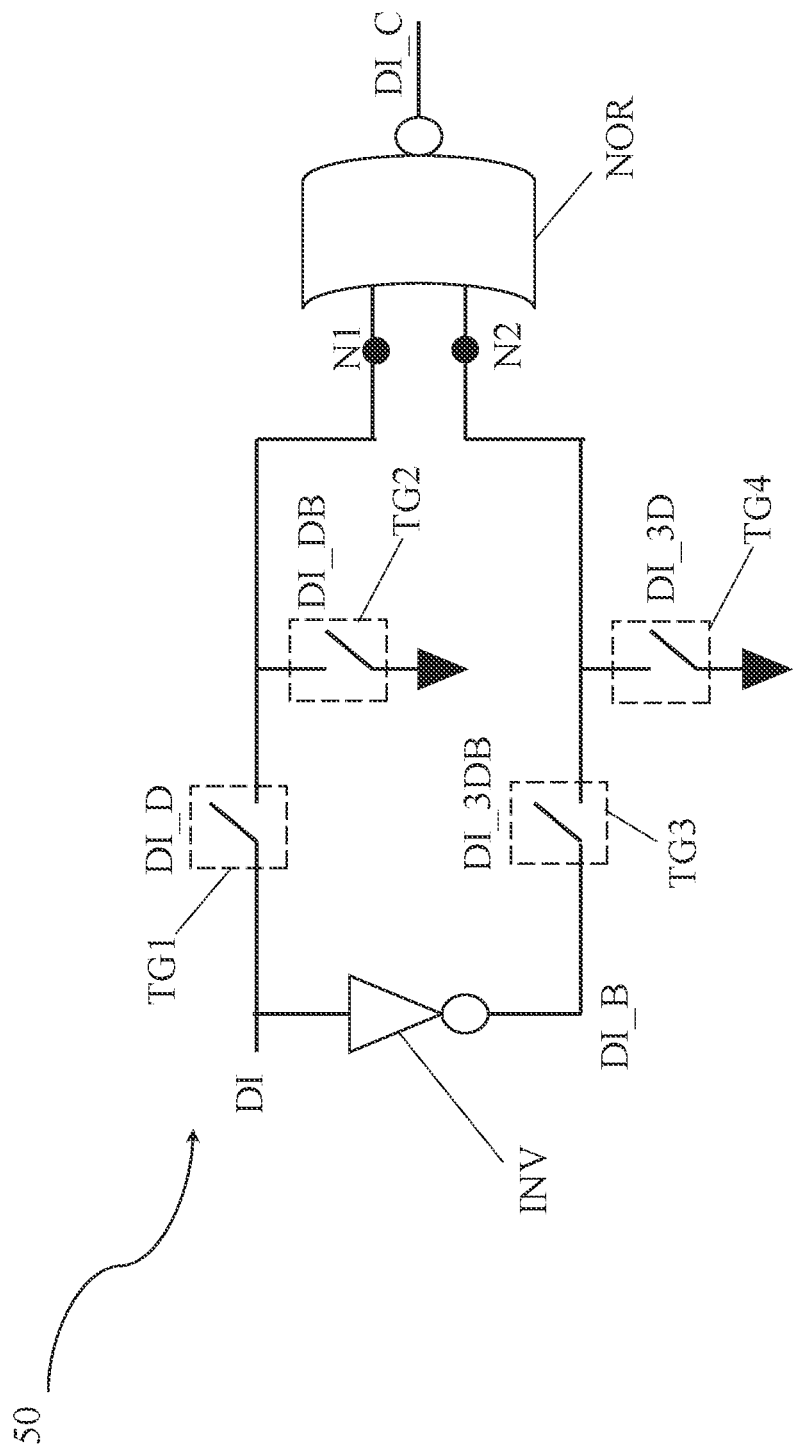
FIG. 9 shows a detailed circuit diagram of a second embodiment of the rising and falling converter in accordance with the present invention.
Figure 10:
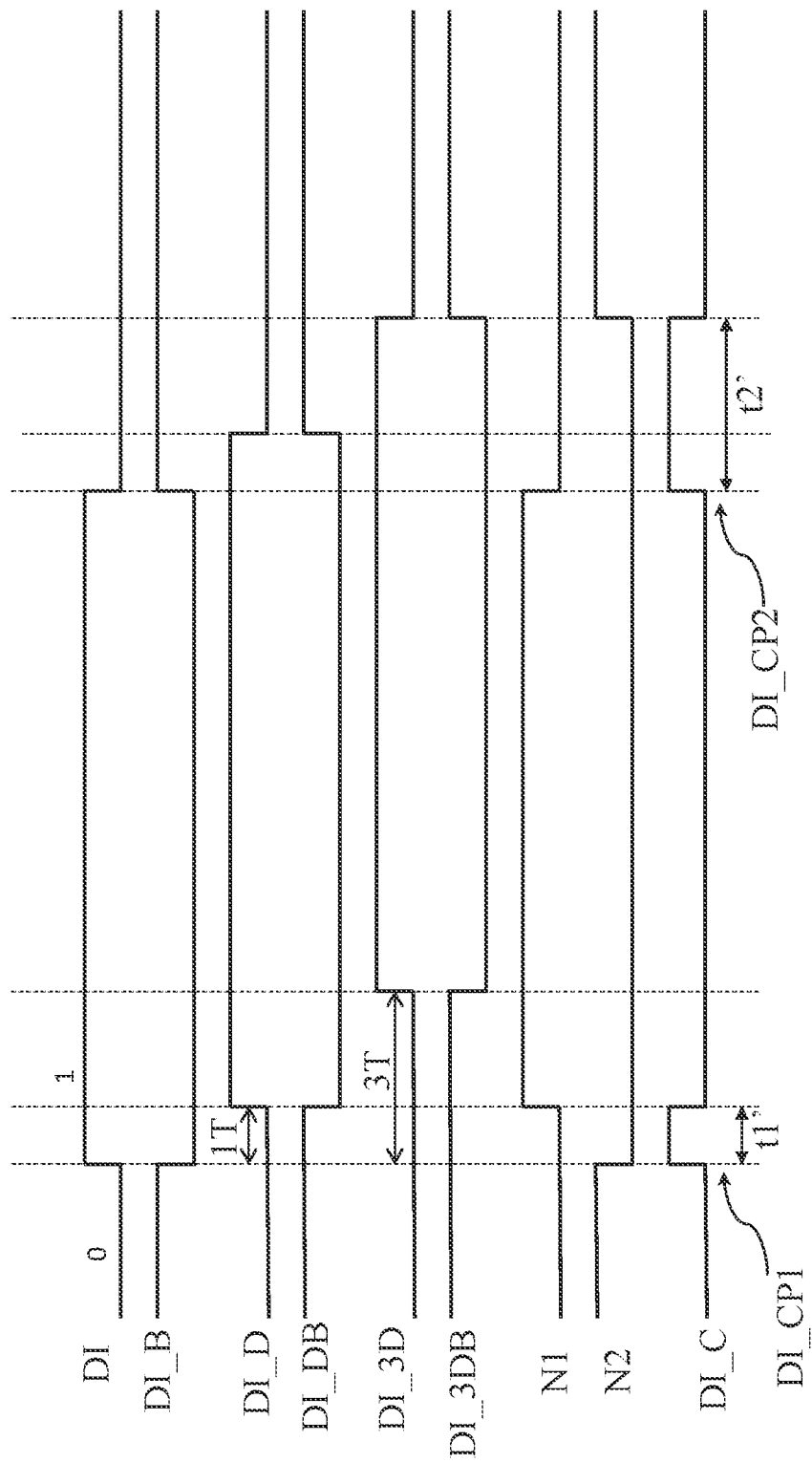
FIG. 10 shows a plurality of illustrated waveforms of the nodes as indicated in FIG. 9.

Furthermore, please refer to FIG. 9, which shows a detailed circuit diagram of a second embodiment of the rising and falling converter in accordance with the present invention. FIG. 10 shows a plurality of the illustrated waveforms of the nodes as indicated in FIG. 9. It is shown that the rising and falling converter 50 includes the inverter INV, the first transmission gate TG1, the second transmission gate TG2, the third transmission gate TG3, the fourth transmission gate TG4 and the NOR gate NOR. The inverter INV receives the data input signal DI and outputs an inverted data input signal DI_B. A first input end N1 of the NOR gate NOR is electrically connected with the first transmission gate TG1 and the second transmission gate TG2, and a second input end N2 of the NOR gate NOR is electrically connected with the third transmission gate TG3 and the fourth transmission gate TG4. The NOR gate NOR outputs the converted data input signal DI_C as shown in FIG. 10 waveform according to the waveforms of the first input end N1 and the second input end N2. As we compare the second embodiment of the rising and falling converter with the previous first embodiment (shown in FIG. 7), it can be observed that the first period used in the second embodiment for delaying the data input signal DI and the inverted data input signal DI_B is 1T, and the second period used for delaying the data input signal DI and the inverted data input signal DI_B is 3T. As such, according to the second embodiment, the control signals of the first transmission gate TG1 and the fourth transmission gate TG4 are the delayed signal "DI_D" and "DI_3D", respectively. The control signals of the second transmission gate TG2 and the third transmission gate TG3 are the delayed signal "DI_DB" and "DI_3DB", respectively.

In such a second embodiment of the rising and falling converter, the second period 3T is longer than the first period 1T, resulting in the second working time t2' of the second partition signal DI_CP2 of the converted data input signal DI_C being longer than the first working time t1' of the first partition signal DI_CP1 of the converted data input signal DI_C.

And therefore, based on the above mentioned embodiments as disclosed in FIG. 7-8 and FIG. 9-10, it is parent that the present invention achieves to sophisticatedly design the rising and falling converter so as to make the first working time t1' of the first partition signal DI_CP1 of the converted data input signal DI_C and the second working time t2' of the second partition signal DI_CP2 of the converted data input signal DI_C are different. It does not matter whether the first working time t1' of the first partition signal DI_CP1 is longer than the second working time t2' of the second partition signal DI_CP2, or the second working time t2' of the second partition signal DI_CP2 is longer than the first working time t1' of the first partition signal DI_CP1. As long as the first working time l1' of the first partition signal DI_CP1 and the second working time t2' of the second partition signal DI_CP2 are different, resulting in the first operational time t1 of the first division signal TXO_D1 of the transmitter output signal TXO and the second operational time t2 of the second division signal TXO_D2 of the transmitter output signal TXO are different, the present invention is effective in realizing an ideal digital isolator and its transmitter circuit structure thereof, and beneficial to reduce power consumption and electromagnetic interferences while compared to the prior arts.

In other words, for people who are skilled in the art and having understandings and technical backgrounds to the present invention, it would be allowed for them to make various modifications or changes depending on different circuit regulations and/or specifications without departing from the scope of the invention. That is to say, the present invention is certainly not limited thereto.

Furthermore, regarding designing a delay and logic unit for replacing a traditional oscillator used in the transmitter circuit structure, the Applicants further provide a detailed circuit diagram of the delay and logic unit in accordance with one embodiment of the present invention in the following paragraphs.

Figure 11:
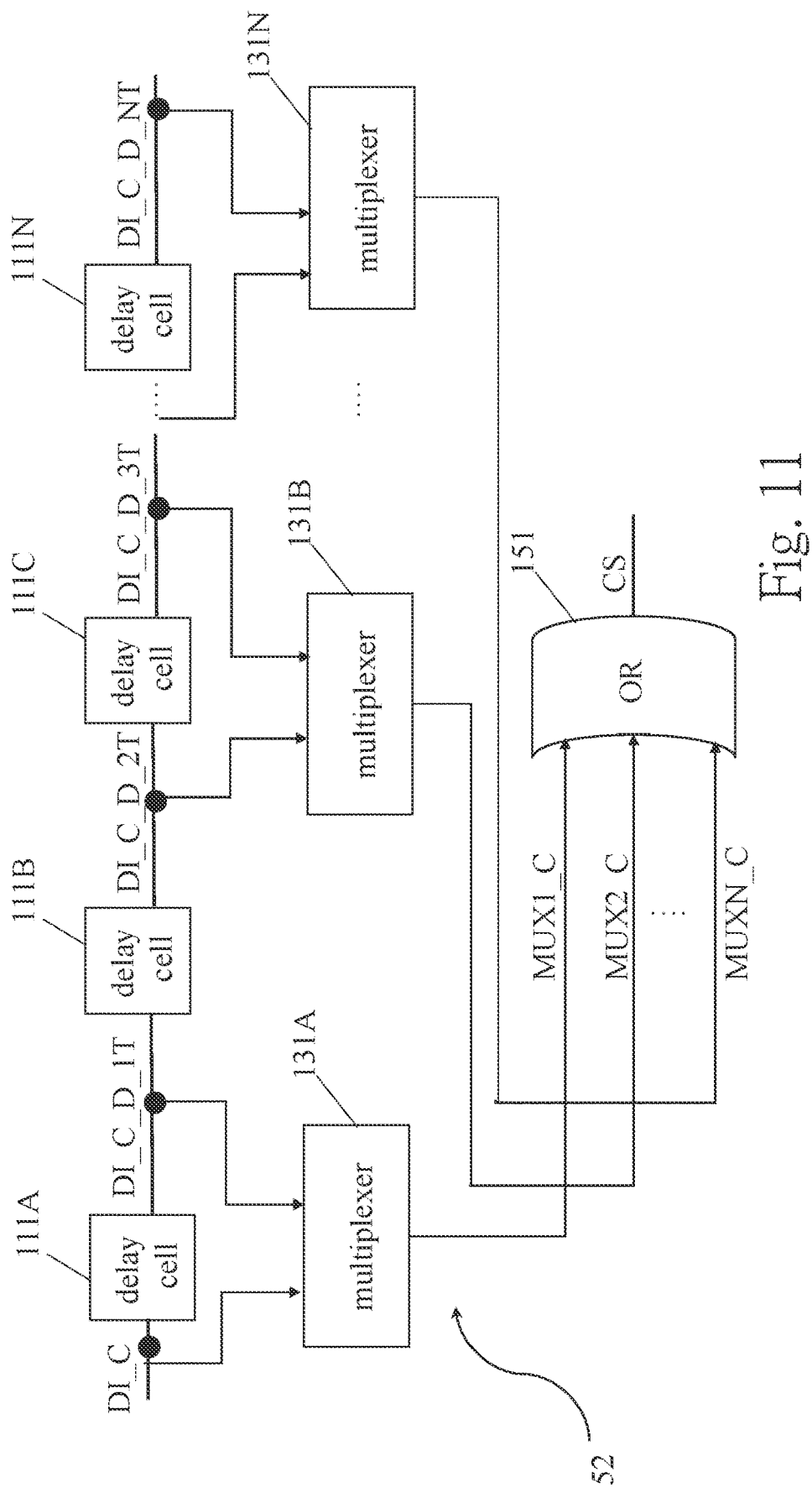
FIG. 11 shows a detailed circuit diagram of the delay and logic unit in accordance with the embodiment of the present invention.
Figure 12:
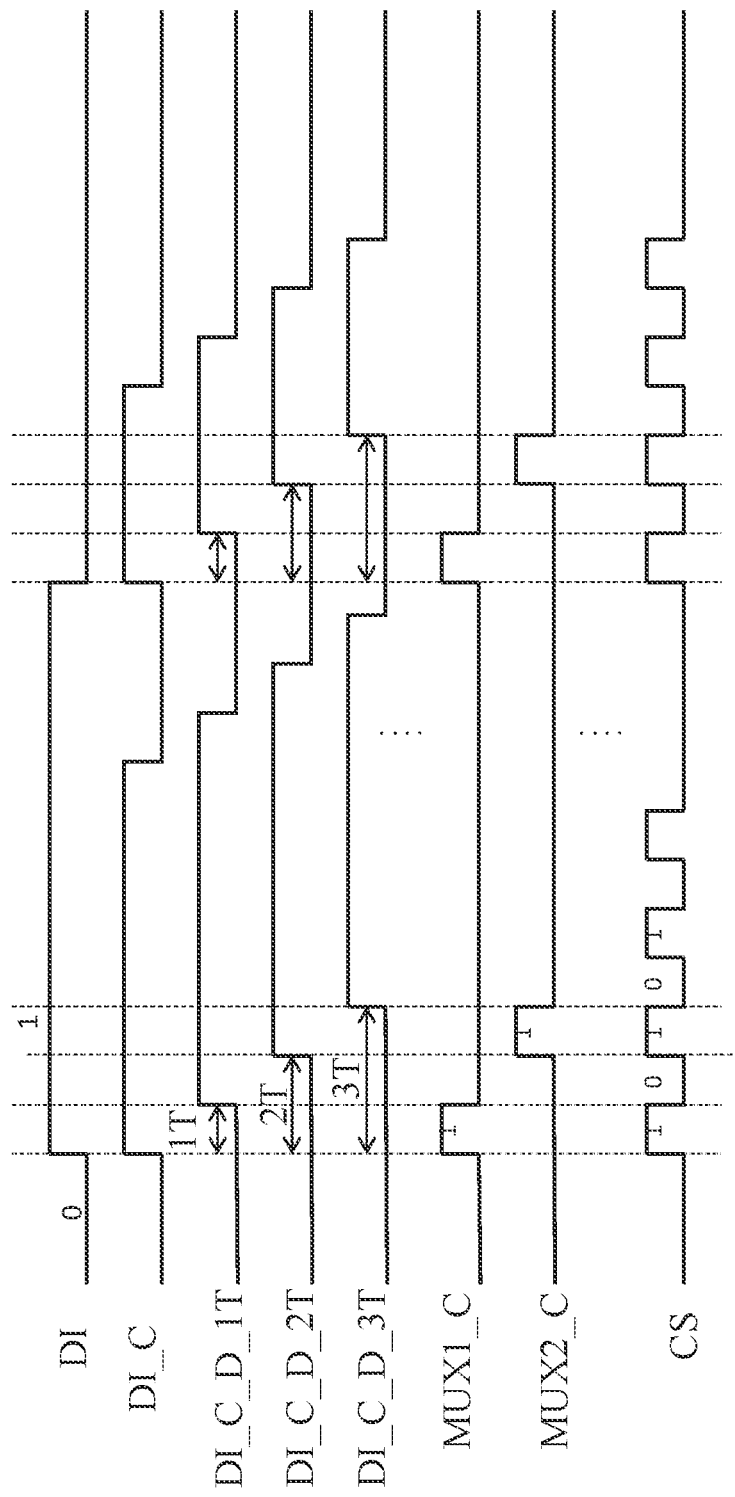
FIG. 12 shows a plurality of illustrated waveforms of the nodes as indicated in FIG. 11.

Please refer to FIG. 11, which shows a detailed circuit diagram of the delay and logic unit in accordance with the embodiment of the present invention. FIG. 12 shows a plurality of illustrated waveforms of the nodes as indicated in FIG. 11. As can be seen, the delay and logic unit 52 comprises multiple delay cells 111A, 111B, 111C . . . 111N, multiple multiplexers 131A, 131B . . . 131N, and an OR gate 151.

The multiple delay cells 111A, 111B, 111C . . . 111N are connected in series to receive the converted data input signal DI_C, delay the converted data input signal DI_C sequentially and output multiple delayed signals DI_C_D_1T, DI_C_D_2T, DI_C_D_3T . . . DI_C_D_NT. According to the embodiment of the present invention, a signal delay time of each of the multiple delay cells 111A, 111B, 111C . . . 111N is one period "T". As a result, the first delay cell 111A receives the converted data input signal DI_C, delay the converted data input signal DI_C by one period 'T' and outputs a first delayed signal DI_C_D_1T. The second delay cell 111B receives the first delayed signal DI_C_D_1T, delay the first delayed signal DI_C_D_1T by one period "T" and outputs a second delayed signal DI_C_D_2T. The third delay cell 111C receives the second delayed signal DI_C_D_2T, delay the second delayed signal DI_C_D_2T by one period "T" and outputs a third delayed signal DI_C_D_3T, and so on.

Each of the multiple multiplexers 131A, 131B . . . 131N includes two input ends and an output end, wherein the two input ends are electrically connected to successive two of the converted data input signal and the multiple delayed signals to accordingly generate a multiplexer signal at the output end. For example, the two input ends of the multiplexer 131A are electrically connected to the converted data input signal DI_C and the first delayed signal DI_C_D_1T to accordingly generate a first multiplexer signal MUX1_C at its output end.

The two input ends of the multiplexer 131B are electrically connected to the second delayed signal DI_C_D_2T and the third delayed signal DI_C_D_3T to accordingly generate a second multiplexer signal MUX2_C at its output end, and so on.

Specifically, please refer to FIG. 12 for the multiplexer signal waveforms. According to the embodiment of the present invention, the multiplexer signal turns to a high voltage level when a former one of the successive two of the converted data input signal DI_C and the multiple delayed signals DI_C_D_1T, DI_C_D_2T, DI_C_D_3T . . . is at the high voltage level and a later one of the successive two of the converted data input signal DI_C and the multiple delayed signals DI_C_D_1T, DI_C_D_2T, DI_C_D_3T is at a low voltage level. As a result, the generated multiplexer signals MUX1_C, MUX2_C . . . can be obtained as shown in FIG. 12 waveforms.

And then, the OR gate 151 is adapted to receive a plurality of the multiplexer signal MUX1_C, MUX2_C . . . MUXN_C from the output end of the multiple multiplexers 131A, 131B . . . 131N and generate the carrier signal CS. From the illustrated waveforms as shown in FIG. 12, it is proven that the generated carrier signal CS comprises a plurality of pulses, and a number of the plurality of pulses of the carrier signal CS is limited and definite. As such, by employing the delay and logic unit 52 configurations, the carrier signal CS having limited and definite pulses is generated to successfully replace the conventional oscillator giving continuous and indefinite pulses. And therefore, it is believed that the present invention performs to effectively solve the enormous power consumption and severe electromagnetic interference issues in the prior arts. And additionally, data output signals can be maintained precisely and avoid jitter problems at the same time.

Therefore, based on at least one embodiment provided above, it is believed that the proposed transmitter circuit of the present invention is characterized by utilizing a novel configuration which comprises a rising and falling converter, a delay and logic unit and an AND gate to replace the conventional oscillator to be used in the prior arts. By such design rules, the transmitter circuit is operable to generate its transmitter output signal (TXO) in response to the data input signal (DI), depending on a rising edge and a falling edge of the data input signal (DI). Under such circumstances, the conventional oscillator configuration is spared, and as such, by employing the proposed circuit diagram, the present invention is believed as beneficial to reducing power consumption and electromagnetic interferences and meanwhile assuring data transmission accuracy and robustness of the system output voltages.

As a result, when compared to the prior arts, it is obvious that the present invention apparently shows much more effective performances than before. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A transmitter circuit, applicable to a digital isolator comprising a receiver circuit and an isolation barrier connected between the transmitter circuit and the receiver circuit, the transmitter circuit adapted to receive a data input signal and coupled to the isolation barrier, the isolation barrier operable to develop a receiver input signal to the receiver circuit for accordingly generating a data output signal;

wherein the transmitter circuit is operable to generate a transmitter output signal in response to the data input signal, the transmitter output signal comprises a first division signal and a second division signal, the transmitter circuit starts to generate the first division signal responsive to a first transition of the data input signal from a first logic state to a second logic state and terminate generating the first division signal when the data input signal is still in the second logic state;

wherein the transmitter circuit starts to generate the second division signal responsive to a second transition of the data input signal from the second logic state to the first logic state and terminate generating the second division signal when the data input signal is still in the first logic state;

wherein a first operational time of the first division signal and a second operational time of the second division signal are different; and wherein the transmitter circuit comprises:
a rising and falling converter, adapted to receive the data input signal and accordingly output a converted data input signal in response to a rising edge and a falling edge of the data input signal, wherein the converted data input signal comprises a first partition signal and a second partition signal, the rising and falling converter starts to generate the first partition signal responsive to the rising edge of the data input signal and terminate generating the first partition signal before the falling edge of the data input signal, and wherein the rising and falling converter starts to generate the second partition signal responsive to the falling edge of the data input signal and terminate generating the second partition signal before a next rising edge of the data input signal, and wherein a first working time of the first partition signal and a second working time of the second partition signal are different;

a delay and logic unit, adapted to electrically connect with the rising and falling converter for receiving the converted data input signal and accordingly generating a carrier signal, wherein the carrier signal comprises a plurality of pulses between the rising edge of the data input signal and the falling edge of the data input signal; and an AND gate, being electrically connected with the rising and falling converter and the delay and logic unit for receiving the converted data input signal and the carrier signal, and outputting the transmitter output signal.

2. The transmitter circuit according to claim 1, wherein the transmitter output signal is periodic.

3. The transmitter circuit according to claim 1, wherein a number of the plurality of pulses of the carrier signal is limited and definite.

4. The transmitter circuit according to claim 1, wherein the first transition of the data input signal from the first logic state to the second logic state is in response to the rising edge of the data input signal.

5. The transmitter circuit according to claim 1, wherein the second transition of the data input signal from the second logic state to the first logic state is in response to the falling edge of the data input signal.

6. The transmitter circuit according to claim 1, wherein the first operational time of the first division signal of the transmitter output signal is equal to the first working time of the first partition signal of the converted data input signal, and the second operational time of the second division signal of the transmitter output signal is equal to the second working time of the second partition signal of the converted data input signal.

7. The transmitter circuit according to claim 1, wherein the delay and logic unit comprises:
multiple delay cells which are connected in series to receive the converted data input signal, delay the converted data input signal sequentially and output multiple delayed signals, wherein a signal delay time of each of the multiple delay cells is one period;
multiple multiplexers, wherein each of the multiple multiplexers includes two input ends and an output end, the two input ends are electrically connected to successive two of the converted data input signal and the multiple delayed signals to accordingly generate a multiplexer signal at the output end; and
an OR gate, adapted to receive a plurality of the multiplexer signal from the output end of the multiple multiplexers and generate the carrier signal.

8. The transmitter circuit according to claim 7, wherein the multiplexer signal turns to a high voltage level when a former one of the successive two of the converted data input signal and the multiple delayed signals is at the high voltage level and a later one of the successive two of the converted data input signal and the multiple delayed signals is at a low voltage level.

9. The transmitter circuit according to claim 1, wherein the rising and falling converter comprises an inverter, a first transmission gate, a second transmission gate, a third transmission gate, a fourth transmission gate and an NOR gate, wherein the inverter receives the data input signal and outputs an inverted data input signal, a first input end of the NOR gate is electrically connected with the first transmission gate and the second transmission gate, a second input end of the NOR gate is electrically connected with the third transmission gate and the fourth transmission gate, the first transmission gate and the third transmission gate are further connected with an input and an output of the inverter, respectively, and wherein the data input signal is delayed by a first period and a second period to respectively control the first transmission gate and the fourth transmission gate, the inverted data input signal is delayed by the first period and the second period to respectively control the second transmission gate and the third transmission gate, in a manner that the NOR gate outputs the converted data input signal.

10. The transmitter circuit according to claim 9, wherein when the first period is longer than the second period, the first working time of the first partition signal of the converted data input signal is longer than the second working time of the second partition signal of the converted data input signal.

11. The transmitter circuit according to claim 9, wherein when the second period is longer than the first period, the second working time of the second partition signal of the converted data input signal is longer than the first working time of the first partition signal of the converted data input signal.

* * * * *